US012766865B2

(12) United States Patent
Alhasan et al.

(10) Patent No.: US 12,766,865 B2
(45) Date of Patent: Oct. 20, 2026

(54) PATTERNING-MEDIATED SUPRAMOLECULAR ASSEMBLY OF LIPIDS INTO NANOSTRUCTURES

(71) Applicant: Smart Products for Consulting and Research, Riyadh (SA)

(72) Inventors: Ali Hussain Alhasan, Riyadh (SA); Samar Abdullah Alsudir, Riyadh (SA)

(73) Assignee: Smart Products for Consulting and Research, Riyadh (SA)

( * ) Notice: Subject to any disclaimer, the term of this patent is extended or adjusted under 35 U.S.C. 154(b) by 822 days.

(21) Appl. No.: 18/066,387

(22) Filed: Dec. 15, 2022

(65) Prior Publication Data

US 2023/0182496 A1 Jun. 15, 2023

Related U.S. Application Data

(60) Provisional application No. 63/289,935, filed on Dec. 15, 2021.

(51) Int. Cl.
*B41M 1/26* (2006.01)
*G03F 7/00* (2006.01)

(52) U.S. Cl.
CPC ............ *B41M 1/26* (2013.01); *G03F 7/0002* (2013.01)

(58) Field of Classification Search
None
See application file for complete search history.

(56) References Cited

PUBLICATIONS

"Writing Behavior of Phospholipids in Polymer Pen Lithography (PPL) for Bioactive Micropatterns" Angelin et al. (Polymers 2019, 11 , 891) (Year: 2019).*

* cited by examiner

*Primary Examiner* — Joshua D Zimmerman
(74) *Attorney, Agent, or Firm* — Finnegan, Henderson, Farabow, Garrett & Dunner LLP

(57) ABSTRACT

Methods of making a supramolecular structure of lipids. The methods include providing an ink made of an aqueous solution of lipid micelles that are deposited onto a polymer pen or an array of polymer pens, such as by an electrospray technique to achieve a homogenous coverage of single and isolated micelles. The method further comprises transferring the ink to a substrate using polymer pen lithography (PPL). Nanoconfinement of the lipid micelles associated with the disclosed method, allow the lipid micelles to rearrange and ultimately lead to a highly ordered and homogenous supramolecular lipid structure. A supramolecular assembly made using the disclosed method and nanoscale delivery system comprising the supramolecular assembly of lipids are further disclosed.

23 Claims, 13 Drawing Sheets

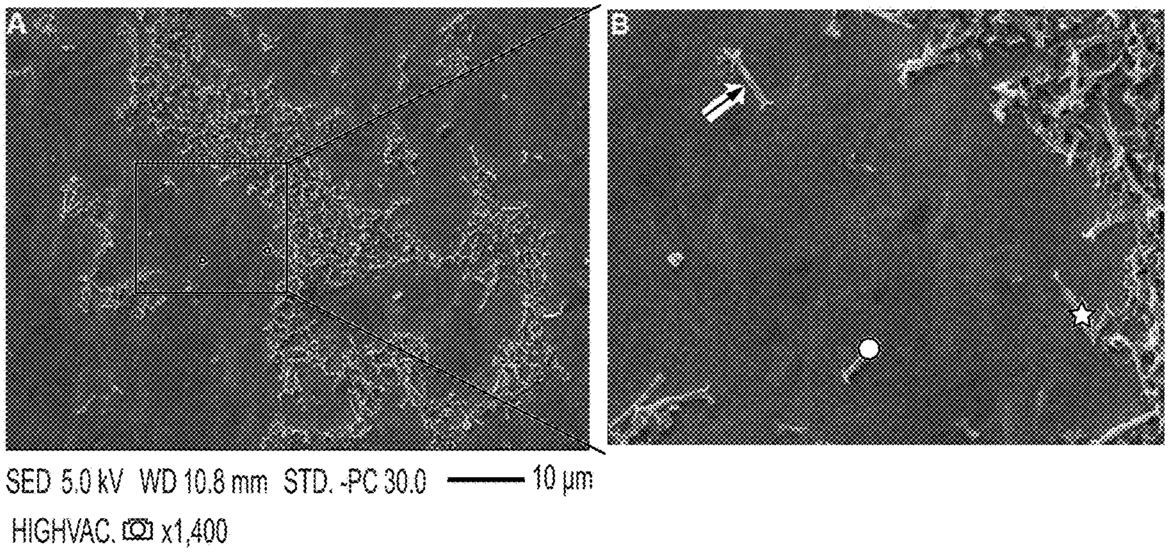
FIG. 4A
FIG. 4B
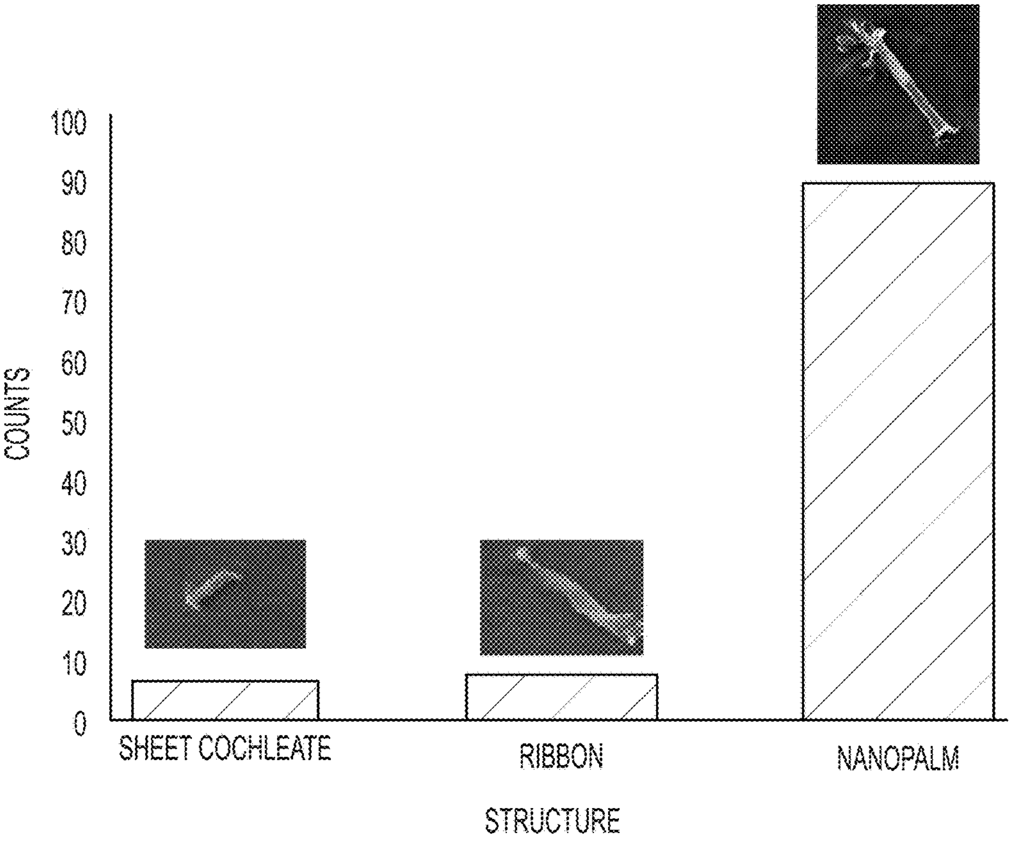
FIG. 4C

SED 5.0 kV WD 11.8 mm STD. -PC 30.0 10 µm
NOR 0662 MAR. 24 2021 HIGHVAC. x2,500

SED 5.0 kV WD 11.1 mm STD. -PC 30.0 2 µm
NOR 0627 MAR. 23 2021 HIGHVAC. x9,500

SED 5.0 kV WD 11.0 mm STD. -PC 30.0 1 µm
NOR 0039 APR. 04 2021 HIGHVAC. x15,000

SED 5.0 kV WD 11.1 mm STD. -PC 30.0 1 µm
NOR 0034 APR. 04 2021 HIGHVAC. x18,000

SED 5.0 kV WD 11.1 mm STD. -PC 30.0 1 µm
NOR 0029 APR. 04 2021 HIGHVAC. x23,000

SED 5.0 kV WD 10.8 mm STD. -PC 30.0 1 µm
NOR 0479 MAR. 14 2021 HIGHVAC. x23,000

SED 5.0 kV WD 10.8 mm STD. -PC 30.0 ——— 1 μm
NOR 0284 JUNE 24 2021 HIGH VAC. x22,000

SED 5.0 kV WD 10.8 mm STD. -PC 30.0 ——— 5 μm
NOR 0269 JUNE 24 2021 HIGH VAC. x5,000

SED 5.0 kV WD 10.8 mm STD. -PC 30.0 ——— 1 μm
NOR 0271 JUNE 24 2021 HIGHVAC. x16,000

SED 5.0 kV WD 10.8 mm STD. -PC 30.0 ——— 500 nm
NOR 0286 JUNE 24 2021 HIGHVAC. x30,000

SED 5.0 kV WD 10.8 mm STD. -PC 30.0 ——— 1 μm
NOR 0267 JUNE 24 2021 HIGHVAC. x23,000

SED 5.0 kV WD 10.7 mm STD. -PC 30.0 ——— 1 μm
NOR 0290 JUNE 24 2021 HIGHVAC. x25,000

PATTERNING-MEDIATED SUPRAMOLECULAR ASSEMBLY OF LIPIDS INTO NANOSTRUCTURES

This application claims the benefit of priority to U.S. Provisional Application No. 63/289,935, filed Dec. 15, 2021, which is incorporated herein by reference in its entirety.

TECHNICAL FIELD

The present disclosure generally relates to patterned lipids and methods of making the same. Such methods are based on nanoconfinement as a way of promoting the self-assembly of such lipids into various secondary/tertiary structures. The present disclosure generally relates to novel quaternary lipid structures, such as nanopalms.

BACKGROUND

Self-assembly is a fundamental bottom-up process inspired by nature and used for the formation of higher-ordered structures starting from liquid disordered phases. Although intramolecular self-assembly produces well-defined secondary and tertiary structures out of polymers, instabilities exist within the corresponding lipid structures owing to their molecular dynamics, which is often dictated by lipid compositions and/or lipid geometry when present in liquid environments. The ability of lipids to undergo supramolecular assemblies to form quaternary structures out of secondary and tertiary structures via intermolecular self-assembly might govern the formation of highly stable lipid structures, which are increasingly adapted for a variety of medical products ranging from organs' self-targeting for accelerating clinical trials, to mRNA delivery, and CRISPER-Cas9 in-vivo gene editing.

Under suitable conditions, lipids could self-assemble into various nano-/micro/mesoscale structures including micelles, spherical vesicles, nanotubes, nanoribbons (planar, undulating, and helical), cochleates, or discotic liquid crystals. Papahadjopouloset et al were the first to discover cochleates in 1975 upon observing bulky fusion and structural rearrangement of the unilamellar negative phosphatidylserine vesicles after $Ca^{2+}$ addition resulting in their electrostatic interactions and subsequent transformation into large sheets. In order to minimize their interactions with the surrounding water molecules, sheets could fold spirally to form tertiary structures known as lipid cochleates. Besides sheets, ribbons are another secondary/tertiary structure that could encounter curling, adhesion, or fusion to form cochleates due to their large energetic unfavorable surfaces. Variously, discotic liquid crystals constitute of multichain lipids such as triglycerides that can self-organize into Y-conformation with fully splayed chains (120° apart) upon increasing temperature or addition of non-polar solvents. These splayed chains are loosely bound within disc-like structures that self-assemble via "interdigitated" stacking forming flexible columns/cylindrical rods. Apparently, the molecular self-assembly of lipids is fairly understood; yet a considerable portion concerning the formation of supramolecular lipid structures remains unexplained.

Patterning of lipids on solid substrates in a spatiotemporally ordered fashion could offer an ideal opportunity for studying quaternary lipid structures. Polymer pen lithography (PPL) has been successfully used for fabricating patterned features made of hard matter such as metals or soft matter including proteins, carbohydrates, oligonucleotides, and lipids rendering it potentially useful in advancing the field of supramolecular chemistry. A typical polymer pen array contains thousands of pyramidal elastomeric pens made of polydimethylsiloxane (PDMS) to deliver different inks to the desired substrates facilitating the development of exquisite patterning capabilities such as multiplexing over $cm^2$ areas with sub-100 nm resolution in a high-throughput manner. Features on the nanometer and micrometer length scales can be fabricated owing to the time and force dependent-ink transport, expanding PPL tunability within the same pen array when brought into contact with the substrate after automated electrical leveling to ensure uniform pattern development. Combinatorial libraries having a tunable gradient of feature sizes can also be fabricated using individual pens by varying either the dwell time or the relative z-piezo extension, or by deliberately tilting the pen array relative to the substrate. PPL has proven to be a powerful strategy for synthesizing complex, polyelemental nanoparticles by patterning polymeric features loaded with metal precursors, so-called nanoreactors, and transforming them into hard structures of metallic nanoparticles via post-patterning gaseous heat treatment. However, generation of soft nanomaterials through PPL-defined nanoconfinement remains unexplored.

There is a need for an improved method and a related system to produce soft nanomaterials through PPL-defined nanoconfinement. The present method, which describes the effect of nanoconfinement of patterned lipids on promoting their self-assemblies into various secondary/tertiary structures when they are forced into close proximity, is directed to overcoming one or more of the problems set forth above and/or other problems of the prior art.

SUMMARY

There is described a method of forming a supramolecular structure of lipids. In one embodiment, the method comprises providing an ink comprising an aqueous solution of lipid micelles that form a primary lipid structure and uniformly depositing the lipid micelles onto one or more pen, or even an array of pens by electrospraying to perform polymer pen lithography (PPL). In one embodiment, electrospraying is performed with optimized parameters including spraying distance, flow rate, and spraying voltage to ensure micelles singularity along with their homogenous coverage of the pen array. In one embodiment, PPL is performed in attoliter volumes via nanoscale tips to achieve nanoconfinement of the lipid micelles and rearrangement of the lipid micelles while being printed on the substrate. The rearrangement of the lipid micelles forms a secondary structure of patterned lipids.

In one embodiment, the described method further includes performing at least one post printing treatment on the secondary structure of patterned lipids to form a quaternary structure upon passing through an intermediate tertiary structure of patterned lipids. For example, there is described a step of chemically treating the secondary structure of patterned lipids with a solvent. In one embodiment, the solvent is in a mixture and contains chloroform ($CHCl_3$)/ethanol (EtOH)/doubled distilled water (DDW) (3:1:1) v/v %.

In one embodiment, the chemical treatment step is followed by sonication and mechanical agitation on the secondary structure of patterned lipids to form a tertiary structure of patterned lipids via intramolecular self-assembly of said lipids. The method further comprises performing at least one treatment step on the tertiary structure of the intramolecularly self-assembled lipids through the complete evaporation of the solvent, e.g., $CHCl_3$ and EtOH, along with continuous stirring to form a quaternary structure of patterned lipids via intermolecular self-assembly of the lipids.

In one embodiment, there is disclosed a supramolecular assembly of lipids made by the disclosed method. For example, the supramolecular assembly may be in the form of nanostructures, such as nanopalms, discotic liquid crystals, cochleate or combinations thereof.

In another embodiment, there is disclosed a nanoscale delivery system comprising the supramolecular assembly of lipids disclosed herein. The disclosed nanoscale delivery systems may be configured to deliver a medicinal component, a protein, gene or portions thereof, a chemical, a nutrient, a food product, a pesticide, or combinations thereof.

BRIEF DESCRIPTION OF THE DRAWINGS

The accompanying drawings, which are incorporated in and constitute a part of this specification, illustrate disclosed embodiments and, together with the description, serve to explain the disclosed embodiments. In the drawings:

FIGS. 1(*c*) and 1(*d*) show scanning electron microscope (SEM) characterization of an inked pen array via electrospraying FIG. 1(*c*) and inked pen array after humidification FIG. 1(*d*).

FIG. 4(*a*) is a SEM micrograph of nanopalms along with their constituents (sheet cochleates (SCs) and ribbons). FIG. 4(*b*) is a zoomed-in view showing an SC (annotated with a white circle), a ribbon (annotated with a white star), and a nanopalm (annotated with a white arrow) while FIG. 4(*c*) is a histogram of counts vs structure verifying the high structural uniformity of nanopalms.

FIGS. 7(*b*)-7(*g*) are micrographs of a scanning electron microscope (SEM) of embodiments of a nanopalm suspension according to the present disclosure.

DETAILED DESCRIPTION OF THE INVENTION

Definitions

Figure 1A:
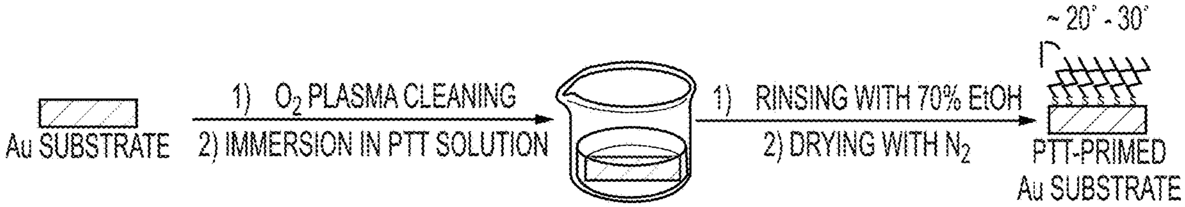
FIGS. 1(*a*) and 1(*b*) show a preparation mechanism according to an embodiment comprising 1-pentanethiol (PTT)-primed gold (Au) substrate and the inked-pen array.
Figure 1B:
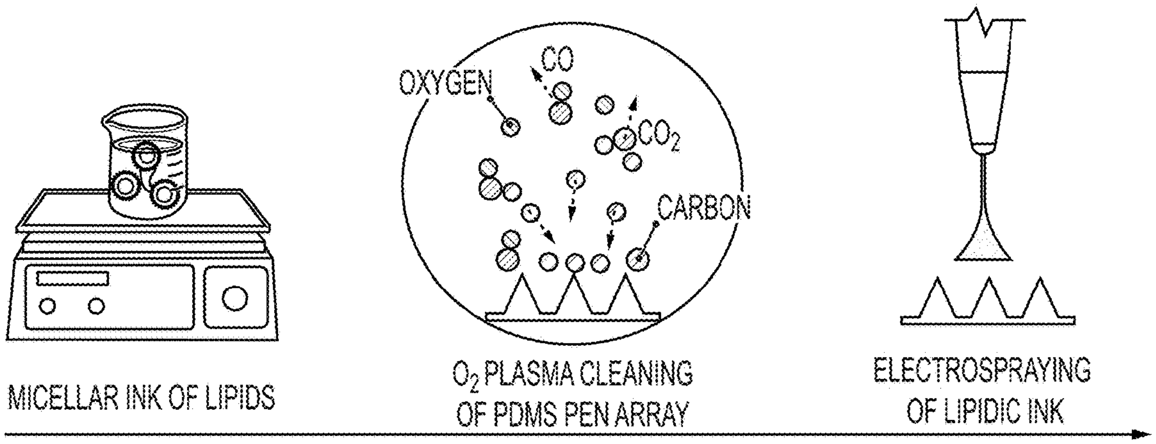
Figure 1C:
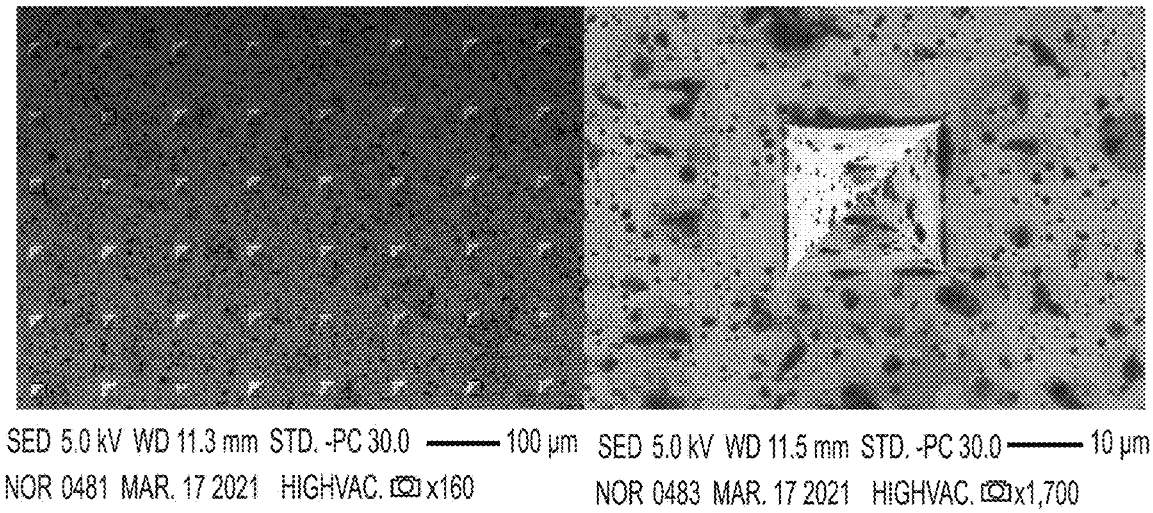
Figure 1D:
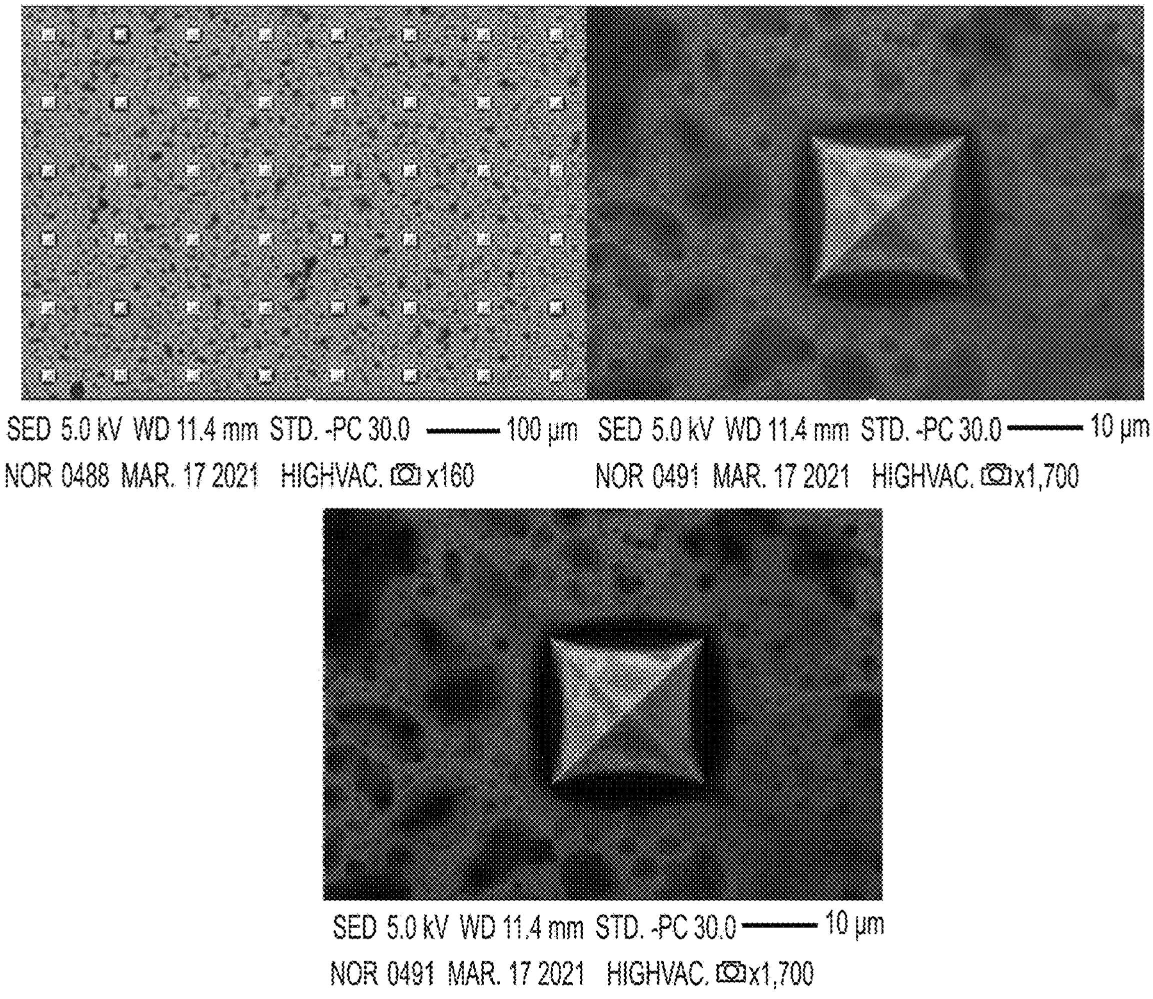
Figure 2A:
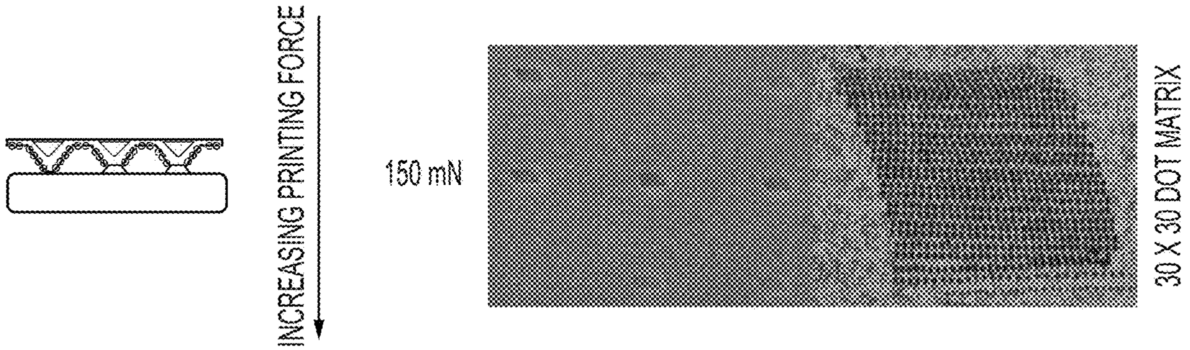
FIGS. 2(*a*)-2(*d*) show polymer pen lithography (PPL) writing schemes at different forces and their corresponding patterned lipid structures for embodiments disclosed herein.
Figure 2B:
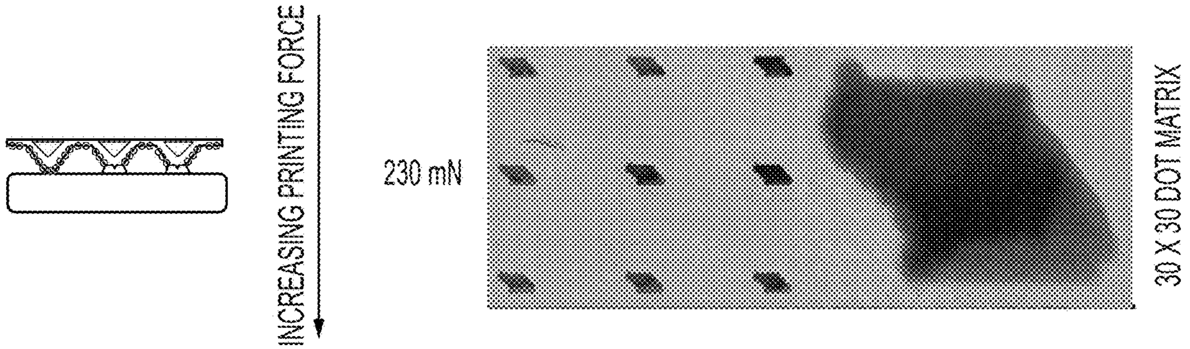
Figure 2C:
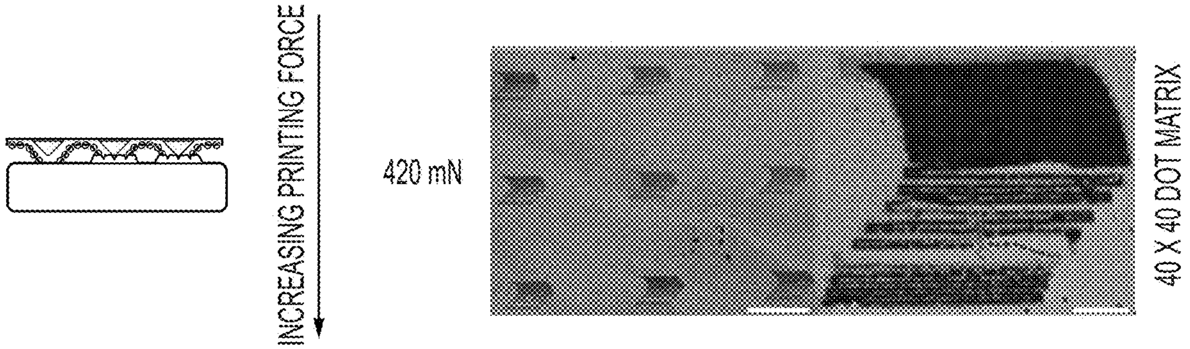
Figure 2D:
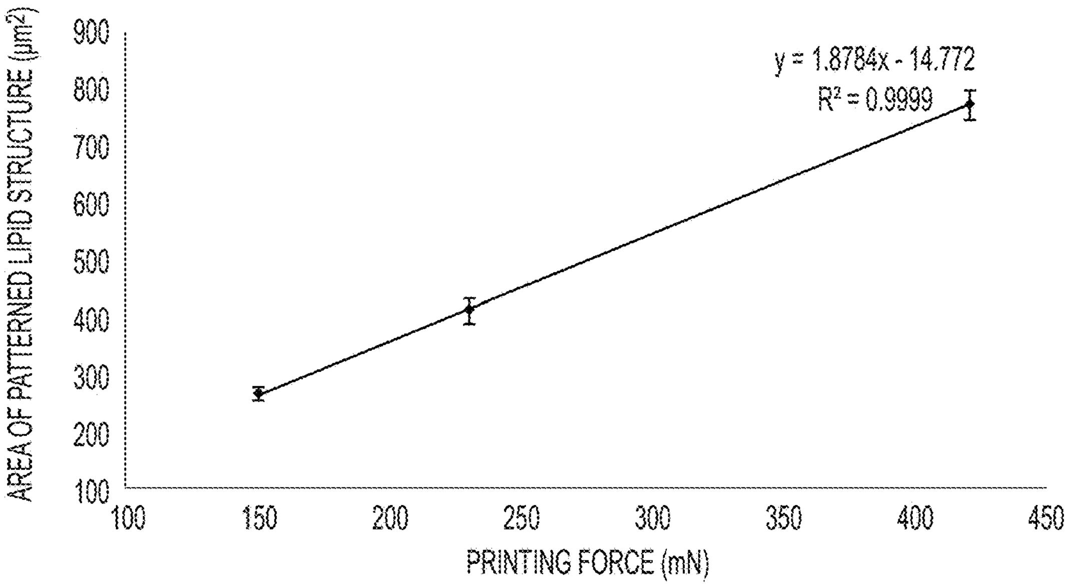

As used herein, "patterning-mediated self-assembly" refers to self-assembly among molecules within the patterned nanoscale features upon printing via nanolithography.

As used herein "inking" refers to the uniform deposition of single and isolated droplet particles with submicron sizes upon applying an electrical field to the liquid passing through a narrow capillary. Inking using electrospraying is affected by a number of process parameters including the applied voltage, flow rate, injector-to-collector distance, and spraying time.

As used herein "nanoconfinement" refers to the physical restriction of molecules within patterned attoliter features of ink (nanoreactors) defined by the nanoscale tips sizes of the polymer pens. In one embodiment, the nanoreactors described herein restrict the movement of molecules, thereby leading to the nanoconfinement of the molecules.

As used herein, "attoliter" is a unit of fluid measure equal to $10^{-18}$ liters.

As used herein, "stability" refers to the preservation of a particular property including shape, size, and structural composition.

As used herein, "highly ordered" refers to the production of a uniformed morphology as a result of re-arranging the primary, secondary, or tertiary structures in a hierarchy.

As used herein "homogeneous" or "homogeneity" refers to the physical continuity of a material in terms of structural similarity (i.e. uniformed morphology, uniformed size, uniformed composition).

Molecular self-assembly has offered a prominent route for the fabrication of well-defined and discrete nano-/micro-structures via programmed arrangement of amphiphilic molecules, which is mainly driven by electrostatic attractions and affected by molecular chirality, elasticity of orientational order, or spontaneous curvature. Hydrophobic interactions, H-bonding, and van der Waals attractive forces could also drive the self-assembly of amphiphilic molecules when dispersed in aqueous environments at concentrations above their critical micelle concentration (CMC). Despite the extensive investigation of supramolecular self-assembly by others, understanding the rules governing this phenomenon remains challenging. Dynamic transition of one self-assembled structure to another occurs under certain conditions till reaching a hierarchical supramolecular structure of enhanced stability.

The various embodiments of the disclosure are described herein, with reference to the figures. The disclosed polymer pen lithography approach permitted the assembly of lipids under nanoconfinement. FIGS. 1(*a*) and 1(*b*) show a preparation mechanism according to an embodiment comprising 1-pentanethiol (PTT)-primed gold (Au) substrate and the inked-pen array. In this embodiment, schemes related to FIG. 1(*a*) shows Au substrate priming with PTT and FIG. 1(*b*) shows PDMS pen array inking with the micellar ink of lipids. FIG. 1(*c*) further shows SEM characterization of inked pen array via electrospraying with scale bar 100 μm (left) and 10 μm (right). FIG. 1(*d*) shows inked pen array after humidification for 2 hours with scale bars 100 μm (left) and 10 μm (right).

Upon adhesion of printed lipid micelles to PTT-primed substrate and following their rupture owing to hydrophobic interactions, the nanoconfinement effect promoted the self-assembly of lipid molecules into discs when they are forced into close proximity. FIGS. 2(*a*)-2(*d*) show PPL writing schemes at different forces and their corresponding patterned lipid structures for embodiments disclosed herein. In particular, FIG. 2(*a*) discs, FIG. 2(*b*) sheets, FIG. 2(*c*) sheet & discs. The scale bars are 50 μm (left images) and 10 μm (right images). FIG. 2(*d*) is a plot representing the area of patterned lipid structures ($\mu m^2$) as a function of the printing force (mN).

Figure 6A:
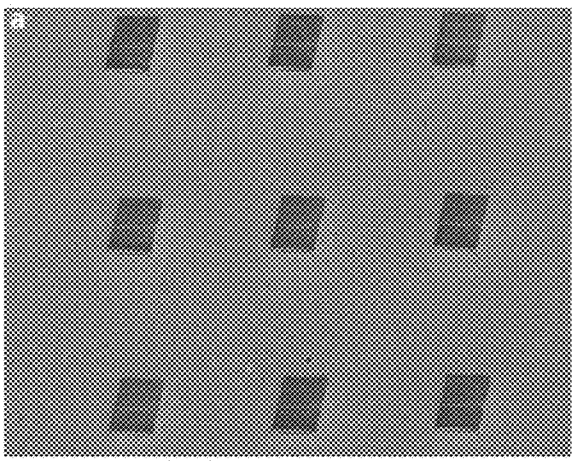
FIGS. 6(*a*)-6(*c*) are scanning electron microscope (SEM) characterization of printed lipid ribbons on 1-pentanethiol (PTT)-primed gold (Au) substrate using PPL (FIGS. 6(*a*) and 6(*b*)) and in solution after emulsification of the printed lipid ribbons (FIG. 6(*c*)).
Figure 6B:
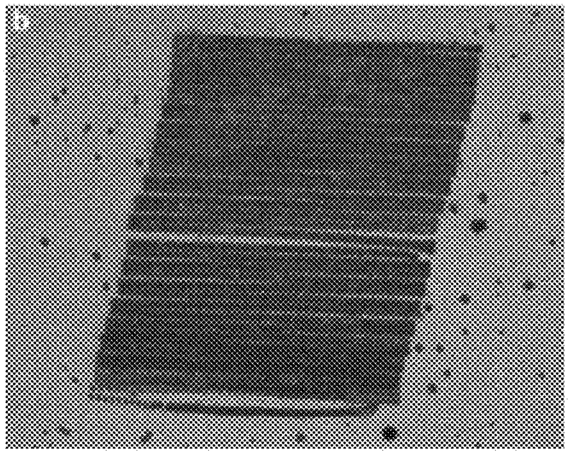
Figure 6C:
Figure 7A:
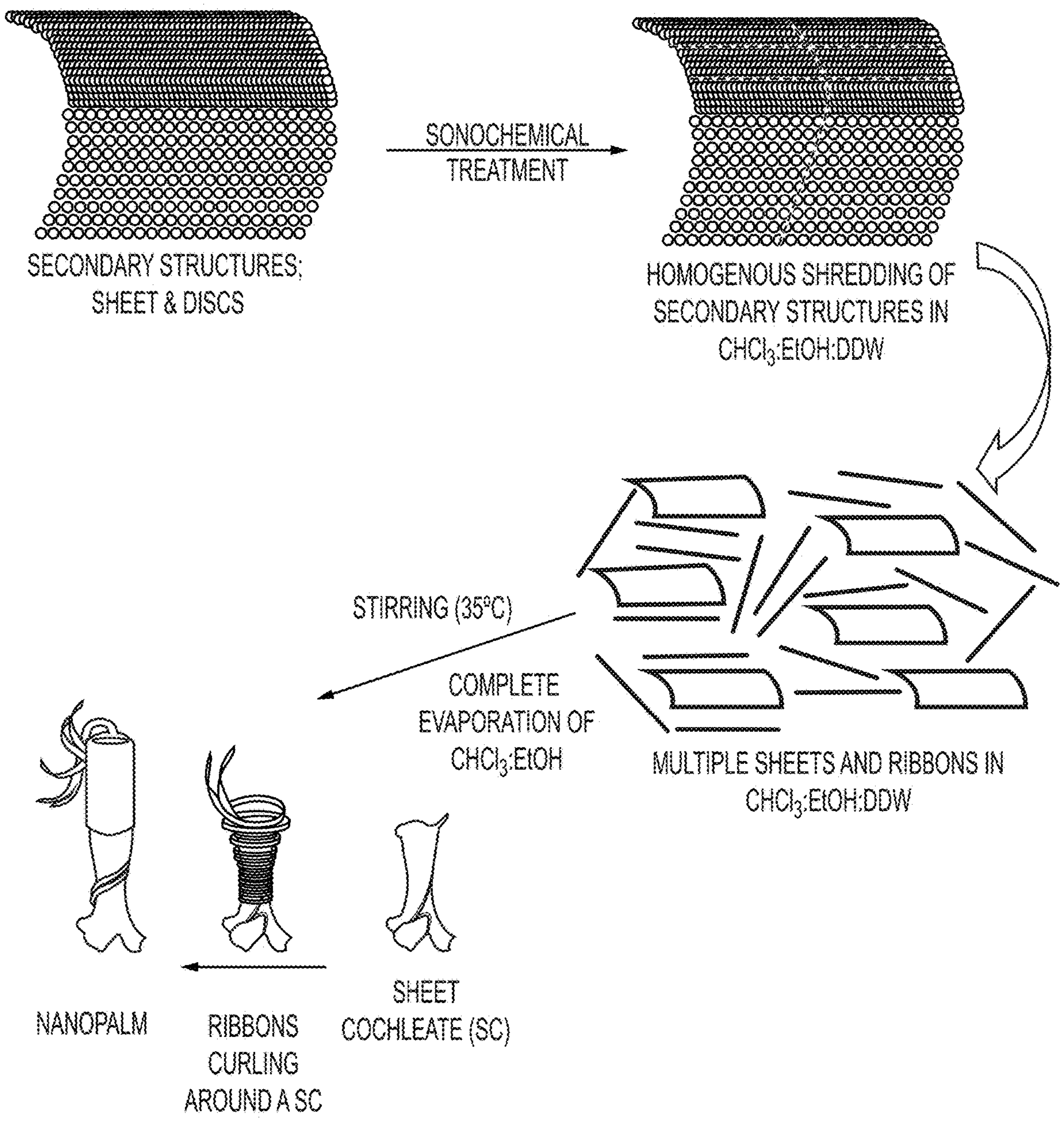
FIG. 7(*a*) is a schematic showing a proposed mechanism of lipid nanopalm formation according to the present disclosure.
Figure 7B:
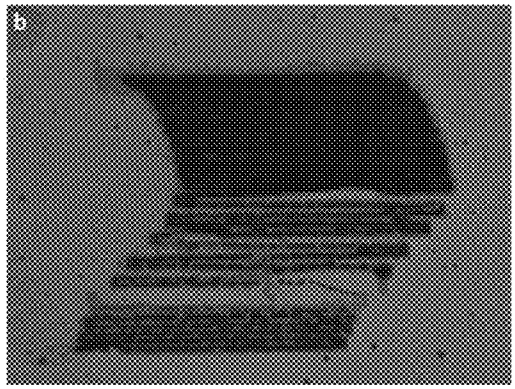
Figure 7C:
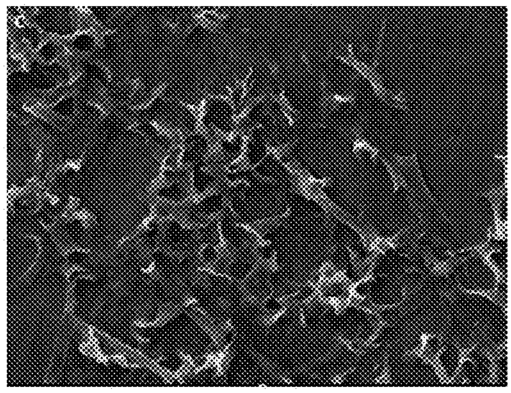
Figure 7D:
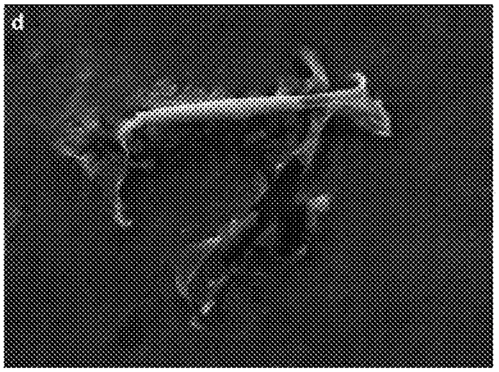
Figure 7E:
Figure 7F:
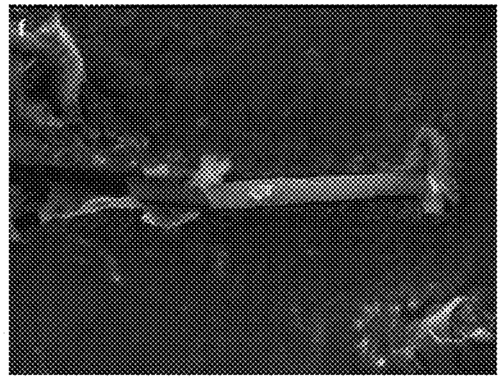
Figure 7G:
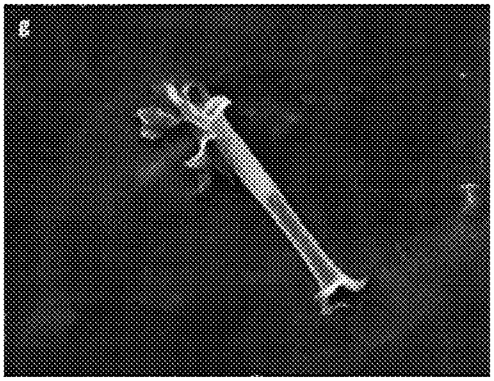
Figure 8A:
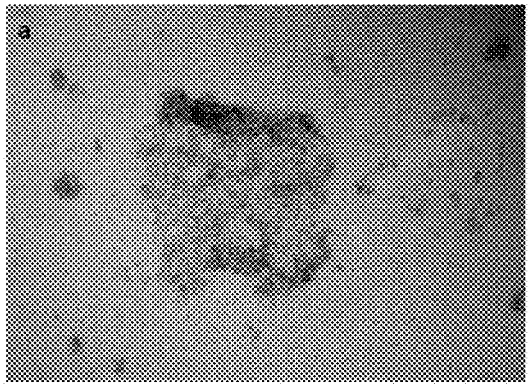
FIGS. 8(*a*)-8(*d*) are transmission electron microscope (TEM) characterization of a sheet (FIG. 8(*a*)), ribbons (FIG. 8(*b*)), a SC (FIG. 8(*c*)), and ribbons wrapping an SC to form a nanopalm (FIG. 8(*d*)).
Figure 8B:
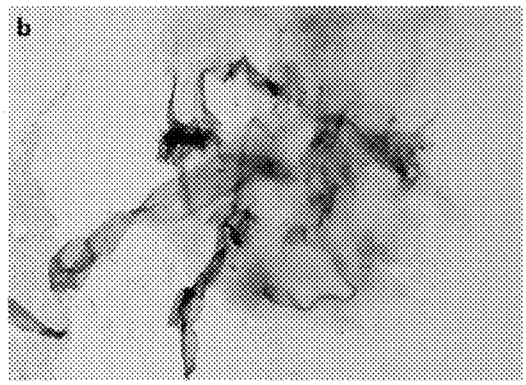
Figure 8C:
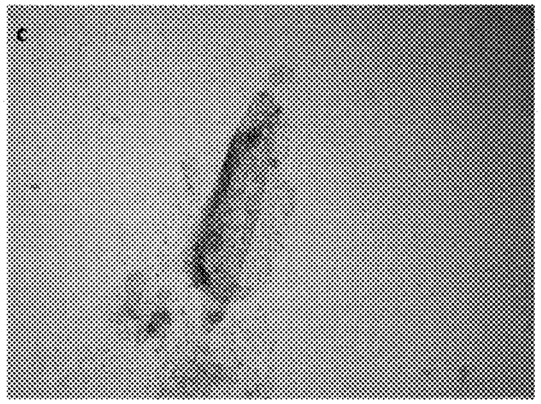
Figure 8D:
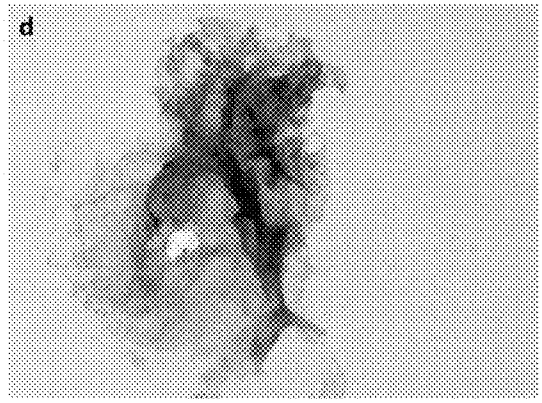
Figure 9A:
FIGS. 9(*a*)-9(*f*) are micrographs of a scanning electron microscope (SEM) showing a nanopalm suspension according to the present disclosure.
Figure 9B:
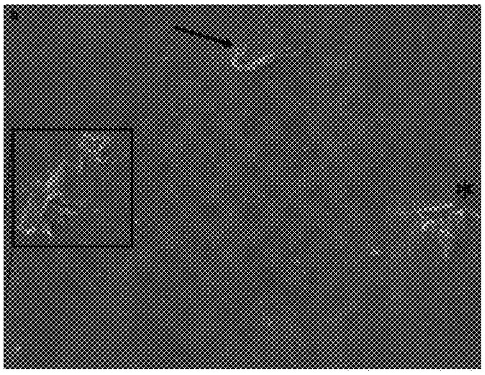
Figure 9C:
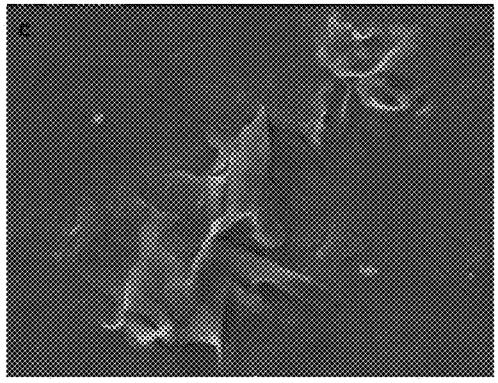
Figure 9D:
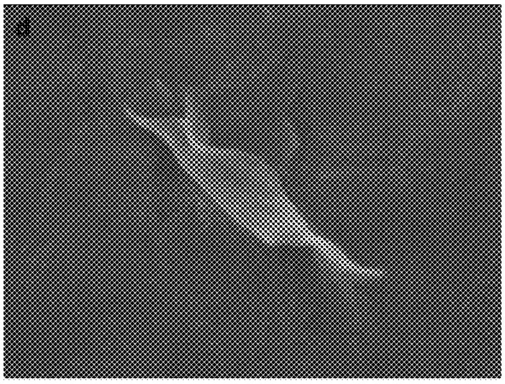
Figure 9E:
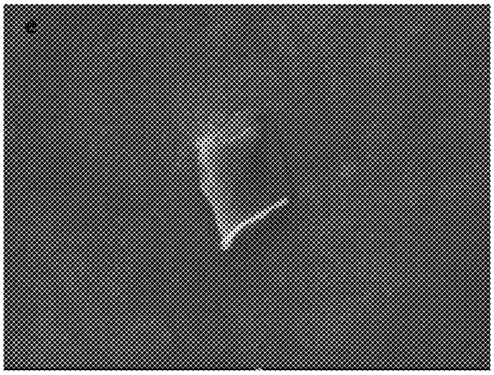
Figure 9F:
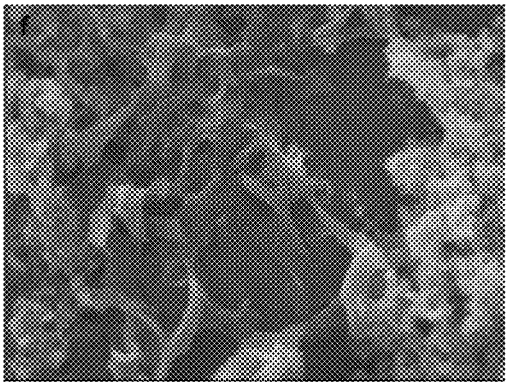

These patterned discs (FIG. 2(*a*)), transformed into various secondary/tertiary structures such as sheets (FIG. 2(*b*)), sheet & discs (FIG. 2(*c*)), or ribbons (FIGS. 6(*a*) and (*b*)) via intramolecular self-assembly mediated primarily by force and humidity in confined spaces. After their transfer in the solvent mixture ($CHCl_3$/EtOH/DDW) via sonication and mechanical agitation (shaking), there was speculation on shredding of the generated lipid structures into smaller sheets and ribbons owing to the sonochemical effect while preserving their original shapes.

Figure 3A:
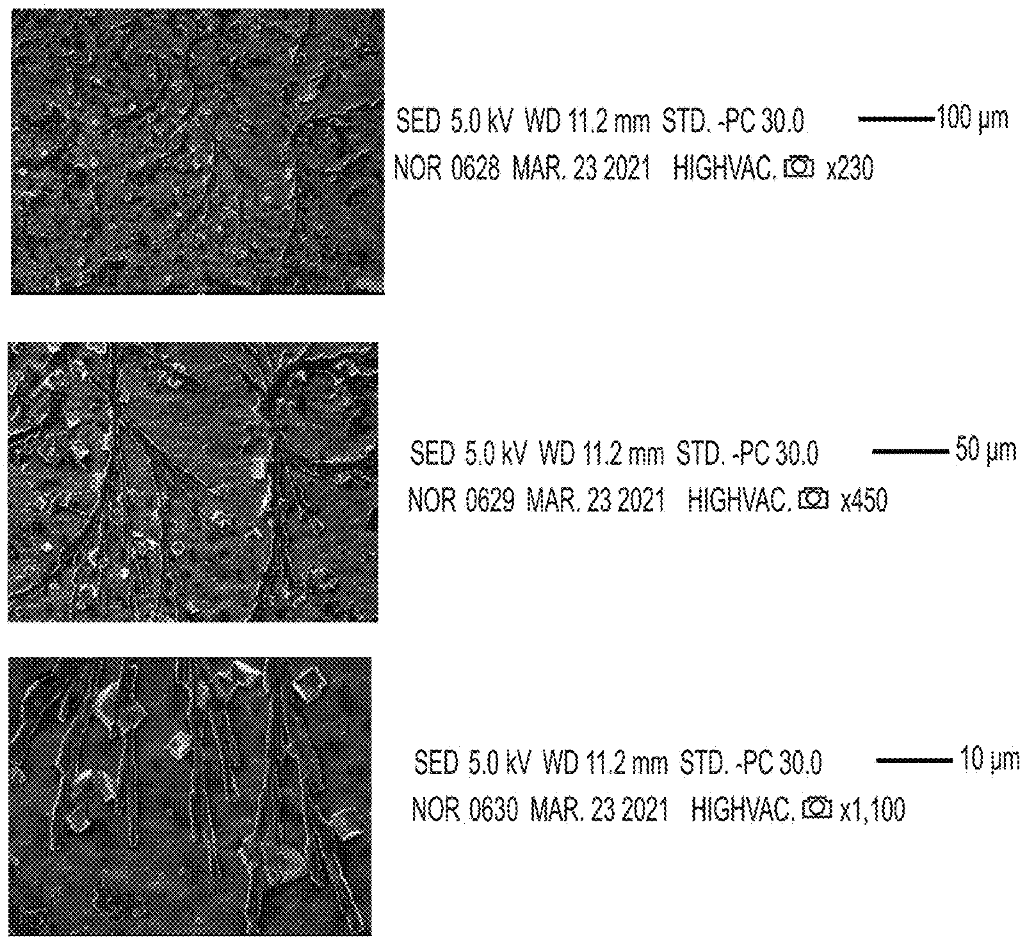
FIGS. 3(*a*)-3(*c*) are scanning electron microscope (SEM) micrographs of the fabricated supramolecular lipid structures according to the present disclosure.
Figure 3B:
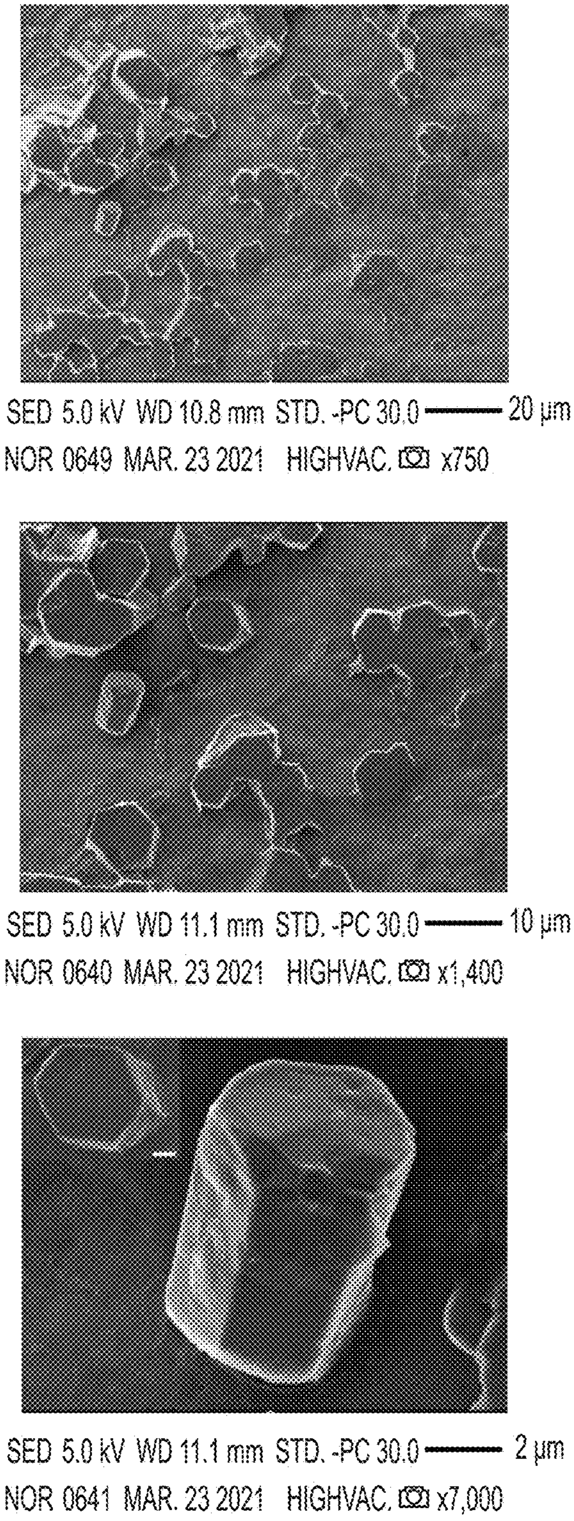
Figure 3C:
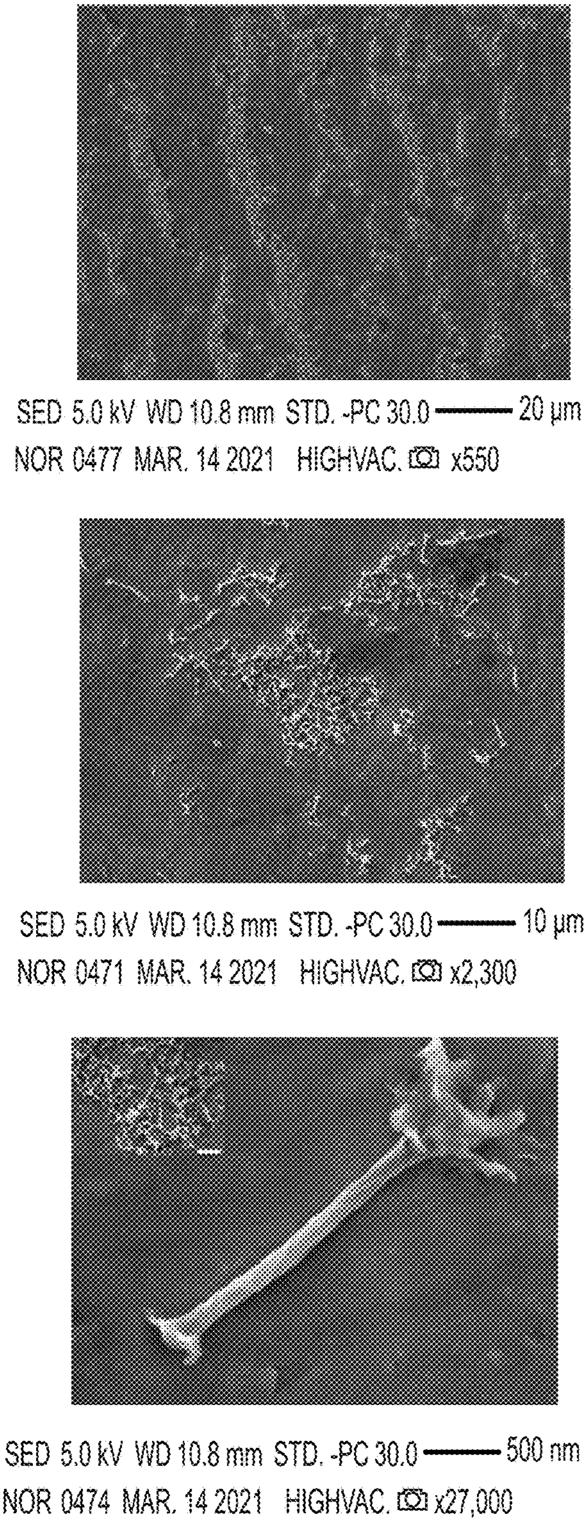

FIGS. 3(*a*)-3(*c*) are SEM micrographs of the fabricated supramolecular lipid structures according to the present disclosure. In particular, the following structures are shown: FIG. 3(*a*) cochleates, FIG. 3(*b*) discotic liquid crystals, FIG. 3(*c*) nanopalms at different scales; 100 μm-500 nm. Scale bar of insets is 2 μm. Complete evaporation of $CHCl_3$ and EtOH along with continuous stirring triggered the formation of different supramolecular structures including cochleates (FIG. 3(*a*)), discotic liquid crystals (FIG. 3(*b*)), and nanopalms (FIG. 3(*c*)). The hierarchical growth upon the controlled self-assembly resulted in a highly ordered novel supramolecular structure through explicit manipulation of the printed lipid structures via PPL. Indeed, supramolecular chemistry could open new perspectives in materials science toward an area of supramolecular materials.

FIG. 4(*a*) is an SEM micrograph showing 7 SCs, 8 ribbons, and 90 nanopalms, which are clearly differentiated in FIG. 4(*b*). FIG. 4(*c*) is a histogram of counts vs structure presenting strong evidence of the high structural uniformity of nanopalms stemming originally from the nanoconfinement of lipids via PPL.

Figure 5A:
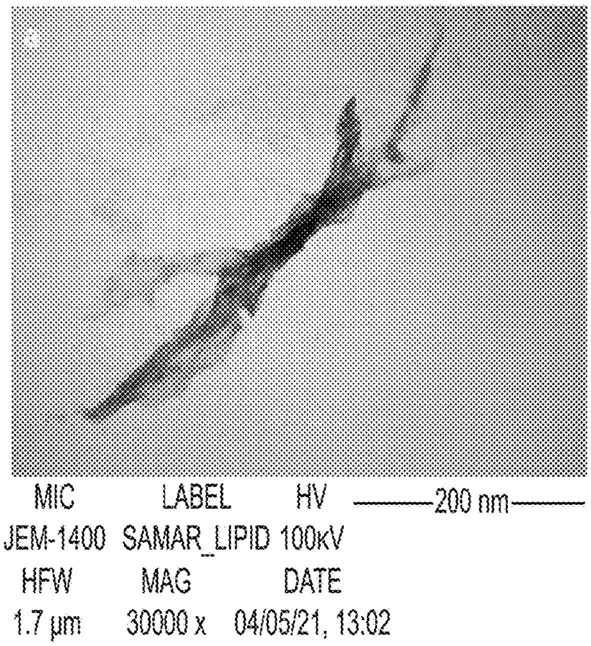
FIGS. 5(*a*)-5(*c*) are the characterization of embodiments of a lipid nanopalm by a transmission electron microscope (TEM) (FIGS. 5(*a*) and 5(*b*)) and a scanning electron microscope (SEM) (FIG. 5(*c*)).
Figure 5B:
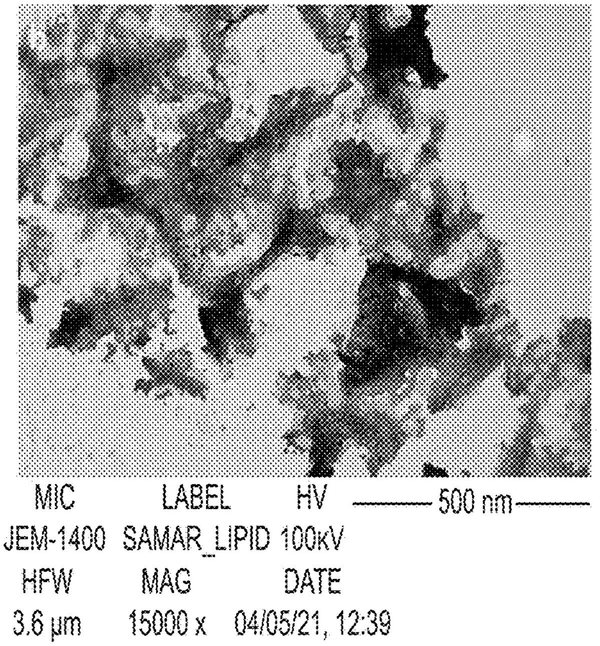
Figure 5C:
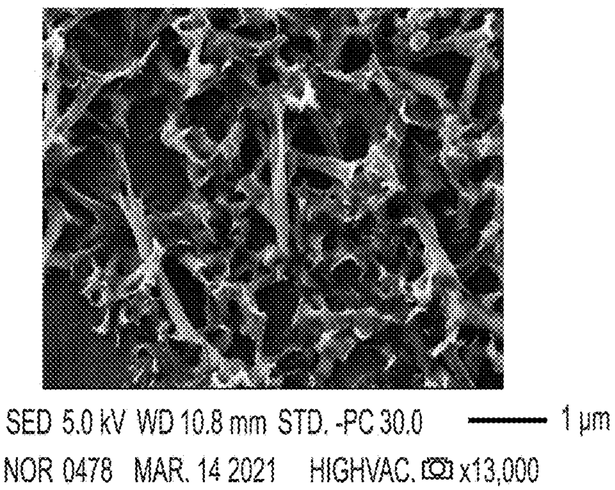

FIGS. 5(*a*) and 5(*b*) are TEM micrographs, while FIG. 5(*c*) is an SEM micrograph of embodiments of nanopalms according to the present disclosure.

FIGS. 6(*a*) and 6(*b*) represent the printed lipid ribbons on 1-PTT-primed Au substrate using PPL. FIG. 6(*c*) shows the random stacking of the printed lipid ribbons after emulsification in the solvent mixture ($CHCl_3$/EtOH/DDW (3:1:1) v/v %).

FIG. 7(*a*) is a schematic showing a proposed mechanism of lipid nanopalm formation according to the present disclosure. FIGS. 7(*b*)-7(*g*) are micrographs of a scanning electron microscope (SEM) of embodiments of a nanopalm suspension according to the present disclosure. For example, FIG. 7(*b*) shows printed "sheet & discs" structure, whereas FIG. 7(*c*) shows fully deformed nanopalms into sheets and ribbons after high-speed vortexing of a 3-week old nanopalm suspension. FIGS. 7(*d*), 7(*e*), and 7(*f*) show partially deformed nanopalms, while FIG. 6(*g*) shows an intact nanopalm according to the present disclosure.

FIG. 8 is a micrograph of a transmission electron microscope (TEM) of embodiments of a 3-week old nanopalm suspension after high-speed vortexing. For example, FIG. 8(*a*) shows a sheet, while FIG. 8(*b*) shows ribbons of a fully deformed nanopalm. FIG. 8(*c*) shows a SC, whereas FIG. 8(*d*) shows ribbons wrapping a SC to form a nanopalm according to the present disclosure.

FIGS. 9(*a*)-9(*f*) are a micrograph of a scanning electron microscope (SEM) showing a nanopalm suspension according to the present disclosure. These figures show characterization of aged nanopalm suspension for 120 days. FIG. 9(*a*) shows an intact nanopalm, FIG. 9(*b*) shows a completely deformed (squared area), partially deformed (*), and an intact nanopalm (→), FIG. 9(*c*) shows a zoomed-in view of the fully deformed nanopalm showing stable sheet and ribbons, FIG. 9(*d*) shows a folded sheet, FIG. 9(*e*) shows an unfolded sheet and FIG. 9(*f*) shows stacked ribbons. Analysis of the aged suspension of nanopalms revealed the high stability of the resulting assemblies (sheets& ribbons) even after 120 days in relation to the same assemblies formed in solution due to cationic bridging. The favorable intramolecular interactions within the confined nanoreactors could stabilize the resulting self-assembled structures. This gives rise to the intuitive intermolecular self-assembly upon the mechanochemical treatment producing highly stable quaternary structures; the nanopalms. However, in the absence of confinement, structural disassembly might occur owing to the metastability of formed lipid structures.

Reported supramolecular lipid structures such as cochleates and tubules originating from the unrestrained self-assembly in solution suffer from heterogeneity or high degrees of polydispersity. This lack of homogeneity could be overcome by PPL which could facilitate the patterning-mediated self-assembly by producing secondary/tertiary structures of high uniformity. Indeed, engineering variables/design principles for generating homogenous supramolecular lipid structures are proposed herein. It has been known that molecules in confined spaces behave distinctly from that in the bulk. Thereby, the nanoconfinement of lipid molecules affects their self-assembly spatially and temporally and thereby determining the structural shape, size, and stability.

Other variables include controlled environmental parameters such as temperature and humidity as well as instrumental parameters including force and printing time, which is mainly affected by the dwell time, pattern size, and z-piezo touch position. Such parameters govern the volume of delivered ink and its diffusivity affecting the shape, area, and uniformity of the resulting patterned structures. Post-patterning treatment is another rule of tremendous impact on the finally produced supramolecular nanostructures. In one non-limiting embodiment, solvents, heat, and stirring all contributed to the folding, scrolling, and formation of highly uniform nanopalms. These cooperative and synergetic rules gave rise to the patterning-mediated self-assembly of the well-defined nanopalms. Indeed, the PPL-controlled generation of nanopalms through self-assembly offers a very powerful alternative to nanofabrication and nanomanipulation, bypassing the implementation of conventional procedures and providing a novel route to nanoscience and nanotechnology.

Figure 10:
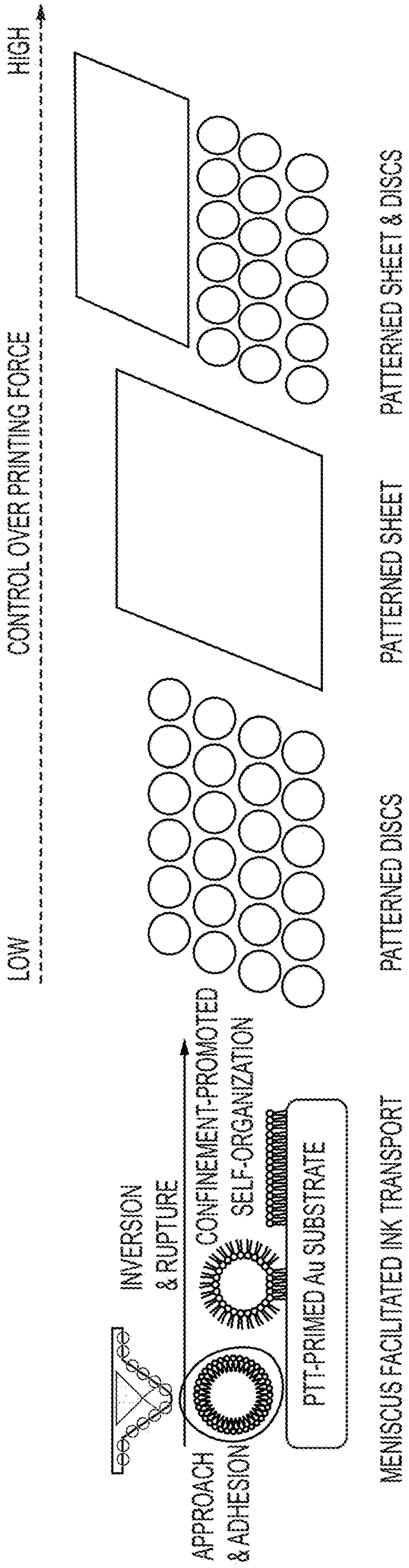
FIG. 10 is a schematic showing force-mediated fabrication of patterned discs, sheet, sheet & discs.

In one embodiment, the present disclosure describes the effect of nanoconfinement of patterned lipids on promoting their self-assemblies into various secondary/tertiary structures when they are forced into close proximity. Accordingly, there has been developed a PPL approach to self-organize a novel quaternary lipid structure; referred to as "nanopalms", each of which is anticipated to be a supramolecular product of the self-assembled secondary/tertiary structures; sheets and ribbons. In one embodiment, controlling printing force can result in fabricating patterns of various structures including discs, sheets, and sheet & discs when delivering a micellar ink of lipids under suitable conditions to the PTT-primed Au substrate as shown in FIG. 10. Subsequent sonochemical treatment of the developed "sheet& discs" structures along with mechanical agitation and solvent evaporation enabled their self-organization into lipid nanopalms.

Examples

The following non-limiting examples, which are intended to be exemplary, further clarify the present disclosure.

Au substrates were plasma cleaned to remove organic contaminants and primed with PTT ethanolic solution under static vacuum at ambient conditions for 24 hours, as shown in FIG. 1(*a*). PTT molecules could self-assemble on Au substrates forming monolayers arranged in trans-conformation with a tilt angle of nearly 20°-30°, which is known for the self-assembled n-alkanethiols on Au surfaces.

PTT modification rendered Au substrates with hydrophobic properties affecting the spreading behavior of the transferred ink onto the substrates. Since the chosen lipid concentrations were above their CMC, micellar ink of lipids was formed in aqueous solution. Simultaneously, PDMS pen arrays were plasma cleaned in order to promote ink wetting prior to electrospraying of the micellar ink solution (FIG. 1(*b*)). In one embodiment, electrospraying was the inking strategy used over spin coating and drop casting since it resulted in uniform ink coverage (FIG. 1(*c*)). In a typical experiment, the pen array was inked via electrospraying using a voltage of 8.4 kV, a flow rate of 1 mL/hr, injector-to-collector distance of 10 cm, and a duration of 10 min. This step is crucial to ensure micelles singularity along with their homogenous coverage of the pen array. The inked pen array was then mounted in the instrument and next incubated at a moderate temperature around 32±2° C. and a relative humidity (RH) of 92±2% for two hours prior to the actual printing process. This step is necessary to enable ink hydration, spreading, and diffusion thereby facilitating its transport to the substrate.

FIG. 1(*d*) shows the synergetic effect of temperature and humidity on ink spreading along with pens coating. Phase transition temperatures (Tm) of 1,2-dioleoyl-sn-glycero-3-phosphocholine (DOPC) and 1,2-dioleoyl-sn-glycero-3-phosphoethanolamine (DOPE) are −17° C. and −16° C., respectively. Hence, their mixture with cholesterol would certainly be in the La liquid state at 32±2° C. DOPC is widely employed as a phospholipid ink in either dip pen lithography or PPL owing to its controllable diffusion by RH in the range of 40-95% under ambient conditions. At a RH higher than 70%, the phospholipid ink becomes sufficiently fluid and readily coats the tips. Hence, temperature and humidity are the parameters to be considered when controlling ink mobility in a uniform fashion.

Nanolithography Printing Design

Printing was carried out using PDMS pen arrays with 100 μm tip-spacing among the 40,000 pens at varied printing forces (150, 230, or 420 mN) and pattern sizes (30×30 or 40×40 dot matrix per one pen) while fixing the other instrumental parameters affecting the printing process including the applied voltage (5 V), current threshold (0.20 mA), dwell time (3 s), step size (0.7 μm), and the approach (100 μm/s) and retract velocities (30 μm/s). A temperature of 32±2° C. and an RH of 92±2% was applied during the whole printing process.

Upon adhesion to the PTT-primed Au substrate, the printed lipid micelles tend to invert owing to the hydrophobic nature of the modified Au substrate (FIG. 10). The subsequent hydrophobic interactions between the inverted micelles and the substrate could possibly result in micelle deformation and rupture followed by self-assembly of lipid amphiphiles, which is a known mechanism for the dynamics of lipid vesicles on hydrophobic surfaces. Resembling the molecular ink diffusive behavior, the phospholipid ink could diffuse in an isotropic fashion, adhere to the substrate, and subsequently self-assemble when forced into close proximity resulting in round printed features (discs) at 150 mN of printing force, as shown in FIG. 2(*a*), These results are in agreement with the previously reported data showing the round features of the printed phospholipids. These features tend to stack three-dimensionally on the substrate owing to the slow spreading kinetics of the phospholipids; yet, they could spread laterally on hydrophobic surfaces to form a thin homogeneous layer when printing is carried out at high humidity (≥90%) and moderate temperature (26±2° C.) for extended periods of time (≥1 hr).

Increasing the printing force to 230 mN FIG. 2(*b*) and 420 mN FIG. 2(*e*) resulted in increasing the tip-substrate contact area as well as the amount of delivered ink allowing the lipid discs to fuse forming other structures; sheets (pattern size of 30×30) and sheet& discs (pattern size of 40×40), respectively. Apparently, implementation of varied parameters within the same overall assembly program results in different self-organization processes and hence various lipid-assembled structures such as discs, sheets, or sheet& discs. Further SEM characterization of the patterned lipid structures can be viewed in FIG. 2(*e*). Being in a very close proximity owing to the confinement effect along with the applied force and humidity, printed discs tend to aggregate, and their outer bilayers leaflets can subsequently merge along with their internal contents permitting their intramolecular self-assembly. Within the force threshold, one can observe a linear relationship between the printing force and the area of lipid structure at a fixed dwell time of 3 s and an RH of 92±2%, as shown in FIG. 2(*d*).

Apparently, generating structures of various areas and shapes is greatly affected by the force-dependent ink transport in parallel to the force and humidity-mediated feature self-assembly. When using the pattern size of 30×30, the area of patterned sheets printed at 230 mN became larger than that of patterned discs printed at 150 mN. Upon increasing the printing force to 420 mN along with utilizing the pattern size of 40×40, the area of patterned sheets and discs became even larger.

Another way to obtain differently sized and shaped structures is by modulating the total time needed for printing, which relates to various parameters including dwell time, pattern size, and the best touch position (which is the z coordinate of the precise/piezo xyz motor upon obtaining an electrical contact between the array and the substrate after automated electrical leveling). Fixing the dwell time while increasing the pattern size and having a longer time per point (relating to the approach and retract velocities and the set z-piezo touch position) could greatly increase the printing total time affecting the resulting shape and size. Indeed, it was possible to generate differently sized and shaped structures by simply controlling the printing force and time. Table 1 summarizes the various experimental and instrumental parameters used for lipid ink printing.

TABLE 1

Various experimental and instrumental parameters used for lipid ink printing

| Shape | Force (mN) | Pattern Size (Dot) | z-piezo touch position(μm) | Dwell time (s) | Step size (μm) | RH (%) | Total time of printing (hrs) |
|---|---|---|---|---|---|---|---|
| Discs | 150 | 30 × 30 | 68 | 3 | 0.7 | 92 ± 2 | 2.00 |
| Sheet | 230 | 30 × 30 | 50 | 3 | 0.7 | 92 ± 2 | 1.75 |
| Sheet& Discs | 420 | 40 × 40 | 77 | 3 | 0.7 | 92 ± 2 | 4.00 |
| Ribbons | 450 | 40 × 40 | 64 | 3 | 0.7 | 92 ± 2 | 3.25 |

Another interesting lipid structure consists of discs fused into ribbons. As shown in FIGS. 2(*a*) and 2(*b*), these structures were obtained with a slight modification of the instrumental parameters used to obtain sheet& discs, which include the printing force (450 mN) and the z-piezo touch position (64 μm). Having a slightly shorter z-piezo touch position profoundly affected the total time of printing (3.25 hrs), which permitted the lateral fusion of discs into ribbons in a highly humid environment (92±2%). Indeed, the total time of printing along with high humidity could intensely alter the final shape of the obtained lipid structures. Hence, PPL provides exquisite control over the spatial and temporal features of lipids.

Emulsion of the Assembled Lipid Structures

Chemical treatment of the patterned lipid structures in a solvent mixture of $CHCl_3$/EtOH/DDW (3:1:1) v/v % along with sonication (10 min) and mechanical agitation (20 min) facilitated their transfer into the liquid phase and possibly shredding into smaller structures while preserving their original shapes. EtOH could readily penetrate into the lipid bilayers and H-bond with the ester oxygens decreasing the interfacial tension of the lipid bilayers. In a similar manner, $CHCl_3$ could partition into different sections of the lipid bilayers altering their inter-leaflet interactions. Such combined effect of the solvent mixture might cause structural curvature and downsizing. Comparably, ultrasonic treatment could induce local stresses via stable cavitation producing shear fields and thereby changing the bilayer curvature along with breaking down the large lipid structures. This mechanism is consistent with the effect of shear fields on producing smaller liposomes. Fast evaporation of $CHCl_3$ and EtOH at 50±5° C. under continuous stirring at 900 rpm produced different supramolecular outputs with regards to the emulsified lipid structures. Well-known lipid structures such as cochleates, as shown in FIG. 3(*a*) or discotic liquid crystals (FIG. 3(*b*)) could be fabricated owing to the hierarchical self-organization of discs or sheets, respectively, via intermolecular self-assembly. In a similar manner, emulsification of the combined structure of sheet& discs along with the slow evaporation of $CHCl_3$ and EtOH (at 35±5° C. under continuous stirring at 900 rpm for 48 hrs) produced a novel homogenous supramolecular structure, shape of which resembles the *Adonidia merrillii* (a.k.a. Christmas palms), and hence the nomenclature "lipid nanopalms", shown in FIG. 3(*c*). Each nanopalm consists presumably of multiple ribbons formed upon discs fusion and wrapped around a SC to form the tightly wrapped lower part while continuing to curl to form the loosely wrapped upper one. FIGS. 4(*a*) and 4(*b*) show a structural characterization of nanopalm and its constituents while FIG. 4(*c*) represents the quantitative determination of the high structural uniformity of nanopalms. The average outer diameters of the tightly and loosely wrapped parts of the nanopalms were 206±20 nm and 267±25 nm, respectively, while its entire length was around 3±1 μm. Further SEM and TEM characterization of lipid nanopalms could be seen in FIGS. 5(*a*)-5(*c*). Apparently, the described PPL method is greatly dependent on printing discs of high consistency along with their consecutive secondary/tertiary structures to fabricate different supramolecular entities of high uniformity. Contrarily, the ribbons structures shown in FIGS. 6(*a*) and 6(*b*) when emulsified resulted in random stacking as shown in FIG. 6(*c*) owing primarily to the absence of chirality in the used phospholipids, which is the common driving force for ribbons scrolling.

Role of Nanoconfinement

The disclosed findings suggest the ability to pattern various structures of lipids including discs, sheets, sheet and discs, or ribbons when lipid molecules are forced into close proximity. This facilitated the fabrication of well-defined morphologies that might not exist in nature such as cochleates, discotic liquid crystals, and nanopalms. Novelty of nanopalms steered the research direction toward investigating their mechanism of formation, which is proposed in FIG. 7(*a*). Emulsification and sonication of the sheet & discs structures shown in FIG. 7(*b*), then complete solvent evaporation triggered discs fusion into ribbons and sheet folding into SC followed by ribbons wrapping the SC while continuing to curl to ultimately form a nanopalm. Such intermolecular self-assembly between the two secondary/tertiary structures, sheets and ribbons, was most likely mediated by hydrophobic interactions and H-bonding. To shed more light into the mechanism of nanopalm formation, there was analyzed a 3-week-old suspension after vigorous vortexing to forcefully deform the nanopalms owing to the high shear stress. Fully deformed nanopalms, shown in FIG. 7(*c*) produced back their secondary/tertiary structures; sheets (folded or unfolded) and ribbons (curled or uncurled). Some nanopalms were partially deformed (FIGS. 7(*d*)-(*f*)) revealing torn ribbons along their rolling direction exposing the inner SCs whereas the others were fully intact. See FIG. 7(*g*). These results along with the TEM images shown in FIGS. 8(*a*)-(*d*) validate the proposed mechanism of nanoplam formation. Apparently, the formed SCs dynamize the curling of ribbons along their folding direction since chirality, which is the usual stimulant for ribbons scrolling, is absent in the used phospholipids.

The aged suspension was further examined after 120 days to determine the stability of the various lipid structures. Stable quaternary structures of nanopalms were observed (FIG. 9(*a*)) along with their constituents; sheets & ribbons (FIGS. 9(*b*) and (*c*)). Folded (FIG. 9(*d*)) or unfolded sheets (FIG. 9(*e*)) and stacks of ribbons (FIG. 9(*f*)) could also be detected. Nanoconfinement apparently stabilizes dynamic assemblies via strengthening the intramolecular bonding in a humid environment. Indeed, the high stability of formed lipid structures evokes exquisite control over the engineering rules adapted for the supramolecular assembly of highly stable nanomaterials.

INDUSTRIAL APPLICABILITY

There is disclosed a method of forming a supramolecular structure of lipids that can be used as nano-scale delivery systems. Indeed, a variety of products can be adapted for this invention. Non-limiting examples of such products include:

- medical uses ranging from organs' self-targeting for accelerating clinical trials, to the delivery of imaging agents for diagnostic purposes, and drug delivery including mRNA-based therapies and CRISPER-Cas9 for in-vivo gene editing;
- delivery systems to be used in the oil industry for enhanced oil recovery (EOR);
- cosmetic formulations for enhanced topical delivery of cosmetics;
- processing, packaging, and development of functional foods to enhance homogenization techniques, protect food from physical damage and increase its shelf-life, and improve the nutritional quality of food;
- pesticides formulation to increase their efficacy and durability as well as reduce the amounts of active ingredients needed to be used;
- paint industry to enhance the properties of paints including mechanical strength, smoothness, and cleanliness besides reducing their cost;
- thermal coatings to improve their insulating properties; and
- the packaging sector to enhance the quality of shock absorbers.

To describe such uses, the method of making the supramolecular structure of lipids is first described. In one embodiment, the method comprises providing an ink comprising an aqueous solution of lipid micelles that form a primary lipid structure and uniformly depositing the lipid micelles onto one or more polymer pens, or even an array of polymer pens by electrospraying to ensure the formation of isolated and singular micelles that homogenously cover the array facilitating their uniform deposition onto a substrate by polymer pen lithography (PPL), such as with an array of polymer pens, including one or more elastomeric pens made of polydimethylsiloxane (PDMS). As used herein, "an array of polymer pens" means an array comprising at least 10 pens, such as at least 100 pens, or even at least 1000 pens, or more than 10,000 pens, or even 100,000 pens. Any of these values can be used as an endpoint in defining the size of the array of polymer pens. For example, as used herein, "an array of polymer pens" means an array comprising at least 10 pens, such as at least 100 pens, or even at least 1000 pens, or more than 10,000 pens or even 100,000 pens. In one embodiment, the array of polymer pens contains between 100 and 100,000 polymer pens, such as from 10,000 to 50,000 polymer pens.

PPL may be performed in attoliter volumes via nanoscale tips to achieve nanoconfinement of the lipid micelles. In an embodiment, the array of polymer pens may be cleaned using oxygen plasma prior to electrospraying of the ink. In an embodiment, the lipid micelles rearrange while being printed on the substrate to form a secondary structure of patterned lipids.

Non-limiting examples of the secondary structure include a disk, a sheet, or combinations thereof. In one embodiment, the printing force of the PPL may be changed, such as within the range of 150 to 450 mN, or even 200 to 400 mN, to change the shape of the secondary structure from a disk to a sheet. In one embodiment, the secondary structure comprises ribbons, sheets, disks, or combinations thereof, with the proviso that when said secondary structure comprises sheets or disks, they are larger in size than the primary structure.

The method further comprises performing at least one post-printing treatment on the secondary structure of patterned lipids. For example, the post-printing treatment may comprise sonochemical treatment, mechanical agitation, or combinations. In addition, post-printing may comprise chemically treating the secondary structure of patterned lipids with a solvent-containing mixture, such as $CHCl_3$/EtOH/DDW. In an embodiment, at least one post-printing treatment step on the secondary structure of patterned lipids forms a tertiary structure of patterned lipids via intramolecular self-assembly of said lipids.

Non-limiting examples of the tertiary structure include curled ribbons, rolled sheets, or combinations thereof, with the proviso that when said tertiary structure comprises curled ribbons or rolled sheets they are smaller in size than the secondary structure.

The method described herein may further comprise performing at least one treatment step on the tertiary structure of the intramolecularly self-assembled lipids to form a quaternary structure of patterned lipids via intermolecular self-assembly of the lipids. The at least one treatment step may be performed on the secondary/tertiary structure to form a quaternary structure comprising solvent evaporation. In one embodiment, the rate of solvent evaporation may be regulated to control the shape of the quaternary structure, such as nanopalms, discotic liquid crystals, cochleate, or combinations thereof.

In one embodiment, the electrospraying may be performed using a voltage of 7.0 to 9.0 kV, a flow rate ranging from 0.5 mL/hr to 1.5 mL/hr, an injector-to-collector distance of 5 to 15 cm, and a duration of 5 to 15 min.

Prior to depositing, the aqueous solution of lipids micelles may be held at a temperature and humidity for a time sufficient to impart the ink with viscosity properties that will allow the ink to uniformly coat the polymer pen array. In one embodiment, printing is performed at a temperature ranging from 30 to 34° C. and relative humidity (RH) ranging from RH 90-94%.

As described herein, the intramolecular self-assembly of secondary lipid structures may be mediated by nanoconfinement resulting from the physical restriction of molecules within patterned attoliter features of ink defined by the nanoscale tips of the polymer pens.

As mentioned, the self-organized lipids made by the disclosed method are highly ordered and homogenous supramolecular lipid structures, typically having stability for up to 120 days. As a result, they make excellent nanoscale delivery systems. Non-limiting examples of the nanoscale delivery systems that can be made from the supramolecular assembly are those that can be configured to deliver a medicinal component, such as to a living organ, a protein, gene, or portions thereof, such as mRNA, DNA, or CRISPER-Cas9, a chemical, a nutrient, a food product, a pesticide, or combinations thereof.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure.

Other embodiments of the invention will be apparent to those skilled in the art from consideration of the specification and practice of the invention disclosed herein. It is intended that the specification and examples be considered as exemplary only, with the true scope of the invention being indicated by the following claims.

What is claimed is:

1. A method of forming a supramolecular structure of lipids, said method comprising:

providing an ink comprising an aqueous solution of lipids that form a primary structure, wherein the concentration of the lipid in the aqueous solution is above critical micelle concentration (CMC) in order to form a micellar ink of lipids in said aqueous solution;

depositing the micellar ink of lipids in the aqueous solution onto one or more polymer pens;

printing the micellar ink of lipids onto a substrate with the one or more polymer pens using polymer pen lithography (PPL), wherein the printed lipid micelles rearrange during printing on the substrate to form a secondary structure of patterned lipids;

performing at least one post-printing treatment on the secondary structure of patterned lipids, wherein the at least one post-printing treatment step on the secondary structure of patterned lipids forms a tertiary structure of patterned lipids by self-assembly of said lipids, wherein the post-printing treatment comprises chemically treating the patterned lipids with a solvent and sonochemical treatment, mechanical agitation, or a combination thereof; and performing at least one treatment step on the tertiary structure of the self-assembled lipids to form a quaternary structure of patterned lipids by self-assembly of said lipids, wherein the at least one treatment step comprises solvent evaporation.

2. The method of claim 1, wherein said depositing is performed using electrospraying, and the one or more polymer pens are plasma cleaned using an oxygen gas prior to electrospraying.

3. The method of claim 2, wherein electrospraying is performed using a voltage ranging from 7.0 to 9.0 kV, a flow rate ranging from 0.5 mL/hr to 1.5 mL/hr, for a duration of 5 to 15 min, wherein the injector-to-collector distance ranges from 5 to 15 cm.

4. The method of claim 1, wherein the secondary structure of patterned lipids is selected from a disk, a sheet, or combinations thereof.

5. The method of claim 4, wherein the polymer pen lithography is performed using an array of polymer pens and with printing force that is sufficient to change the shape of the secondary structure from a disk to a sheet.

6. The method of claim 5, wherein the printing force ranges from 150 to 450 mN.

7. The method of claim 1, wherein printing is performed at a temperature ranging from 30 to 34° C. and a relative humidity (RH) ranging from RH 90-94%.

8. The method of claim 1, wherein the secondary structure comprises ribbons, sheets, disks, or combinations thereof, and when said secondary structure of patterned lipids comprises sheets or disks, they are larger in size than the primary structure.

9. The method of claim 1, wherein the tertiary structure comprises curled ribbons, rolled sheets, or combinations thereof, and when said tertiary structure comprises curled ribbons or rolled sheets they are smaller in size than the secondary structure.

10. The method of claim 1, wherein the rate of solvent evaporation is regulated to change the shape of the quaternary structure, the shape is selected from nanopalms, discotic liquid crystals, cochleate or combinations thereof.

11. The method of claim 1, wherein the solvent comprises a mixture of $CHCl_3$/EtOH/DDW.

12. The method of claim 1, wherein the self-assembly of secondary lipid structures is intramolecular and mediated by nanoconfinement.

13. The method of claim 12, wherein the one or more polymer pens have nanoscale tips that result in nanoconfinement of the secondary lipid structure.

14. The method of claim 1, wherein prior to depositing, the aqueous solution of lipids micelles is held at a temperature and humidity for a time sufficient to impart the ink with desired viscosity properties.

15. The method of claim 1, wherein the polymer pen comprises one or more elastomeric pens made of polydimethylsiloxane (PDMS).

16. The method of claim 1, wherein the quaternary structure comprises an ordered and homogenous supramolecular lipid structure having stability for up to 120 days.

17. The method of claim 1, wherein the polymer pen lithography is performed using an array of polymer pens comprising 500 to 50,000 pens in said array.

18. A supramolecular assembly of lipids made by the method of claim 1.

19. A supramolecular assembly of claim 18, which is in the form of nanopalms, discotic liquid crystals, cochleate, or combinations thereof.

20. A nanoscale delivery system comprising the supramolecular assembly of lipids of claim 18.

21. The nanoscale delivery system of claim 20, which is configured to deliver a medicinal component, a protein, a gene or portions thereof, a chemical, a nutrient, a cosmetic, a food product, a paint, a pesticide, or combinations thereof.

22. The nanoscale delivery system of claim 21, wherein the medicinal component is delivered to a living organ.

23. The nanoscale delivery system of claim 21, wherein the protein, gene or portions thereof comprise mRNA, DNA, or CRISPER-Cas9.

* * * * *